US012805276B2

(12) United States Patent
Tang

(10) Patent No.: US 12,805,276 B2
(45) Date of Patent: Nov. 17, 2026

(54) METHOD OF FABRICATION FOR A SEMICONDUCTOR STRUCTURE COMPRISING AN ISOLATION STRUCTURE

(71) Applicant: ChangXin Memory Technologies, Inc., Hefei City (CN)

(72) Inventor: Yi Tang, Hefei City (CN)

(73) Assignee: Changxin Memory Technologies, Inc., Hefei (CN)

( * ) Notice: Subject to any disclaimer, the term of this patent is extended or adjusted under 35 U.S.C. 154(b) by 457 days.

(21) Appl. No.: 18/547,767

(22) PCT Filed: Jun. 6, 2023

(86) PCT No.: PCT/CN2023/098676
§ 371 (c)(1),
(2) Date: Aug. 24, 2023

(87) PCT Pub. No.: WO2024/027332
PCT Pub. Date: Feb. 8, 2024

(65) Prior Publication Data

US 2024/0170324 A1 May 23, 2024

(30) Foreign Application Priority Data

Aug. 2, 2022 (CN) ......................... 202210922714.2

(51) Int. Cl.
*H10W 10/00* (2026.01)
*H10P 14/60* (2026.01)
(Continued)

(52) U.S. Cl.
CPC ....... *H10W 10/014* (2026.01); *H10P 14/6526* (2026.01); *H10P 50/282* (2026.01);
(Continued)

(58) Field of Classification Search
CPC ... H10W 10/014; H10W 10/17; H10W 20/01; H10W 10/011; H10W 10/10;
(Continued)

(56) References Cited

U.S. PATENT DOCUMENTS 9,324,731 B1 * 4/2016 Lai ......................... H10B 43/27
9,947,804 B1 * 4/2018 Frougier ............ H10D 30/6743
(Continued)

FOREIGN PATENT DOCUMENTS

CN 112928065 A 6/2021
CN 113540090 A 10/2021
(Continued)

OTHER PUBLICATIONS

PCT/CN2023/098676 International Search Report mailed Sep. 13, 2023.

*Primary Examiner* — Mohammad M Hoque
(74) *Attorney, Agent, or Firm* — Intellectual Valley Law, P.C.

(57) ABSTRACT

A method for fabricating a semiconductor structure and the device are disclosed. The method includes: providing a first sacrificial layer and semiconductor columns on a substrate; forming an isolation structure, disposed between adjacent stacked structures along the first direction; etching the isolation structure to form a through-hole, the through-hole exposes a part of the surface of the substrate, and also exposes each side of each stacked structure; along the second direction, the width of the bottom of the through-hole is greater than the width of the top of the through-hole, and the second direction is perpendicular to the first direction; the first sacrificial layer exposed by the through-hole is laterally etched, and a part of the first sacrificial layer is removed. A sacrificial layer exposes the top surface and the bottom surface of each semiconductor column. The present
(Continued)

disclosure improves the morphology of the semiconductor structure.

17 Claims, 25 Drawing Sheets

(51) Int. Cl.

| | |
|---|---|
| ***H10P 50/28*** | (2026.01) |
| ***H10W 10/17*** | (2026.01) |
| *H10B 10/00* | (2023.01) |
| *H10B 12/00* | (2023.01) |

(52) U.S. Cl.
CPC ............. *H10W 10/17* (2026.01); *H10B 10/12* (2023.02); *H10B 12/30* (2023.02)

(58) Field of Classification Search
CPC ... H10P 14/6526; H10P 50/282; H10B 10/12; H10B 12/30; H10B 12/05; H10B 43/27
USPC .......................................................... 257/296
See application file for complete search history.

(56) References Cited

U.S. PATENT DOCUMENTS

| | | | | |
|---|---|---|---|---|
| 10,453,824 | B1 * | 10/2019 | Mochizuki | H10D 64/017 |
| 10,615,257 | B2 * | 4/2020 | Ok | H10D 62/121 |
| 2018/0175167 | A1 * | 6/2018 | Reboh | H10D 62/121 |

FOREIGN PATENT DOCUMENTS

| | | | |
|---|---|---|---|
| CN | 113644061 | A | 11/2021 |
| CN | 114171521 | A | 3/2022 |

* cited by examiner

METHOD OF FABRICATION FOR A SEMICONDUCTOR STRUCTURE COMPRISING AN ISOLATION STRUCTURE

CROSS REFERENCES TO RELATED APPLICATIONS

This application claims the benefit of priority of Chinese patent application submitted on Aug. 2, 2022, entitled "METHOD OF FABRICATION FOR A SEMICONDUCTOR STRUCTURE", with the application number 202210922714.2, the contents of which are incorporated herein by reference in its entirety.

TECHNICAL FIELD

The present disclosure relates to the field of semiconductor technology, in particular to a method for fabricating a semiconductor structure and a semiconductor structure.

BACKGROUND

The integration density of the dynamic memory has been developing toward higher levels, and higher demands have been imposed on the size of the transistors and how they are arranged in array structures.

At present time, in order to increase the memory integration density, at the same time, maintain a high speed and low power consumption, 3D stacked memory has lead the research direction in the industry. The 3D stacked memory has the advantage of high density, large capacity and high speed.

However, the currently fabricated 3D stacked semiconductor structures have the problem of poor morphology, which affects the performance of the memory devices.

SUMMARY

An embodiment of the present disclosure provides a method for fabricating a semiconductor structure, comprising: providing a substrate; forming a stacked structure arranged at intervals along a first direction on the substrate, the stacked structure comprising alternately stacked first sacrificial layer and the semiconductor column; forming an isolation structure, the isolation structure is disposed between the adjacent stacked structures along the first direction; etching the isolation structure to form a through-hole, and the through-hole exposes the surface of the substrate part, and also exposes the side of each of the stacked structures, along the second direction, the width of the bottom of the through-hole is greater than the width of the top of the through-hole, the second direction is the same as the first The direction is vertical; the first sacrificial layer exposed by the through-hole is laterally etched, and part of the first sacrificial layer is removed to expose the top surface and the bottom surface of each of the semiconductor columns.

In some embodiments, the ratio of the width of the top of the through-hole to the width of the bottom of the through-hole is in the range of 0.75-0.95.

In some embodiments, the method for forming the through-hole includes: performing an etching process on the isolation structure to form two grooves spaced along the second direction in the isolation structure. The groove exposes a part of the surface of the substrate, and also exposes a part of the side of the stack structure extending along the second direction; in the second direction, the top width of the groove is larger than the bottom width of the groove; a support layer structure is formed in the groove, and the sides of the two support layer structures are in contact with the isolation structure; the isolation structure disposed between the two support layer structures is etched to expose The side of the support layer structure forms the through-hole.

In some embodiments, the cross-sectional shape of the groove perpendicular to the first direction is an inverted trapezoid.

In some embodiments, along the second direction, the ratio of the width of the top of the groove to the width of the bottom of the groove ranges from 1.05 to 1.25.

In some embodiments, the through-holes include: a first through-hole and a second through-hole connected to each other, the first through-hole is disposed on a side of the second through-hole away from the substrate, so the cross-sectional shape of the first through-hole perpendicular to the first direction is rectangular, and the cross-sectional shape of the second through-hole is trapezoidal.

In some embodiments, the method for forming the through-hole includes: performing an etching process on the isolation structure to form two first grooves distributed along the second direction in the isolation structure, the first groove exposes part of the isolation structure, and in the second direction, the cross-sectional shape of the first groove perpendicular to the first direction is rectangular; on the side of the first groove, the wall forms a mask layer; the isolation structure exposed at the bottom of the first groove is etched to form a second groove, the second groove connects with the first groove, and In the second direction, the cross-sectional shape of the second groove perpendicular to the first direction is an inverted trapezoid; a first sub-supporting layer is formed in the first groove, and in the second groove forming a second sub-support layer; etching the isolation structure disposed between the two first sub-support layers to form the first through-hole; etching the isolation structure disposed between the two second sub-support layers, the isolation structure forms the second through-hole; the first through-hole connects with the second through-hole to form one through-hole.

In some embodiments, in a direction perpendicular to the substrate, the ratio of the height of the first through-hole to the height of the second through-hole is in a range of 0.1-0.3.

In some embodiments, along the second direction, the width of the first groove is greater than the top width of the second groove, after forming the first groove, the method includes: using a deposition process to form the mask layer on the surface of the isolation structure exposed on the side wall of the first groove, the mask layer surrounds the first sub-groove, and along the second direction, the mask layer width of the first sub-groove is smaller than the width of the first groove; the isolation structure exposed at the bottom of the first sub-groove is etched to form a second groove, along the second direction Above, the top width of the second groove is equal to the width of the first sub-groove; the mask layer is removed.

In some embodiments, along the second direction, the width of the first groove is equal to the width of the top of the second groove, after forming the first groove, the method including: processing the isolation structure exposed on the side wall of the first groove, so as to convert the isolation structure exposed on the side wall of the first groove into the mask layer with a preset thickness; The isolation structure exposed at the bottom of the first groove is etched to form a second groove, and along the second direction, the width of the top of the second groove is equal to the width of the first groove.

In some embodiments, the isolation structure is silicon oxide, and the processing of the isolation structure exposed on the side wall of the first groove includes: exposing the side wall of the first groove, performing nitriding treatment on the isolation structure to form silicon nitride with a predetermined thickness.

In some embodiments, the method for forming the groove includes: performing a modification process on the isolation structure, in a direction along the isolation structure to the substrate, in the etching process, the etching ratio of the top of the isolation structure is greater than that of the bottom of the isolation structure; an etching process is performed on the isolation structure to form the groove.

In some embodiments, in a direction along the isolation structure to the substrate, the etching ratio of the isolation structure by the etching process gradually decreases.

In some embodiments, the through-holes include: a first through-hole and a second through-hole connected together, and along the second direction, the cross-sectional shape of the first through-hole is a rectangle, so the cross-sectional shape of the second through-hole is trapezoidal, and the method for forming the first through-hole and the second through-hole includes: performing a modification process on the isolation structure to form a first region and a second region. The isolation structure of the first region is disposed on the side of the isolation structure of the second region away from the substrate, and in the direction along the isolation structure pointing to the substrate, the etching process for the first region. The etching ratio of the isolation structure is constant, and the etching ratio of the isolation structure in the second region is gradually reduced by the etching process; the etching process is performed on the isolation structure to form in the first region a third groove, forming a fourth groove in the second region; forming a third sub-support layer in the third groove, forming a fourth sub-support layer in the fourth groove; etching at the isolation structure between the two third sub-support layers forms the first through-hole; the isolation structure between the two fourth sub-support layers is etched to form the second through-hole.

In some embodiments, the etching ratio of the first region by the etching process is equal to the etching ratio of the top of the second region by the etching process.

In some embodiments, the semiconductor columns further includes: a channel region, and the removal of part of the first sacrificial layer to expose the top surface and the bottom surface of each of the semiconductor columns is: exposing the channel on the top and side surfaces of the semiconductor columns in the region further include: forming word lines, the word lines wrapping the side surfaces of the channel region of a column of the semiconductor columns.

Correspondingly, an embodiment of the present disclosure also provides a semiconductor structure on the other hand, including: a substrate; on the substrate, semiconductor columns arranged in an array along a first direction and a vertical direction; an isolation structure between adjacent semiconductor columns, the isolation structure includes an isolation substructure and supporting layer structures disposed on both sides of the isolation substructure along the second direction; in the second direction, the bottom width of the isolating substructure is larger than the top width of the isolation substructure, the top width of the support layer structure is larger than the bottom width of the support layer structure, and the second direction is perpendicular to the first direction.

BRIEF DESCRIPTION OF THE DRAWINGS

One or more embodiments are illustrated by the pictures in the accompanying drawings corresponding thereto, and these exemplary illustrations do not constitute a limitation to the embodiments, and unless otherwise stated, the figures in the accompanying drawings do not constitute scale restriction; in order to more clearly illustrate the technical solutions in the embodiment of the present disclosure or the conventional technology, the following will briefly introduce the accompanying drawings that need to be used in the embodiment. Obviously, the accompanying drawings in the following description are only the disclosure of the present disclosure For some embodiments, those of ordinary skill in the art can also obtain other drawings based on these drawings without any creative effort.

DETAILED DESCRIPTION OF THE PREFERRED EMBODIMENTS

Figure 1:
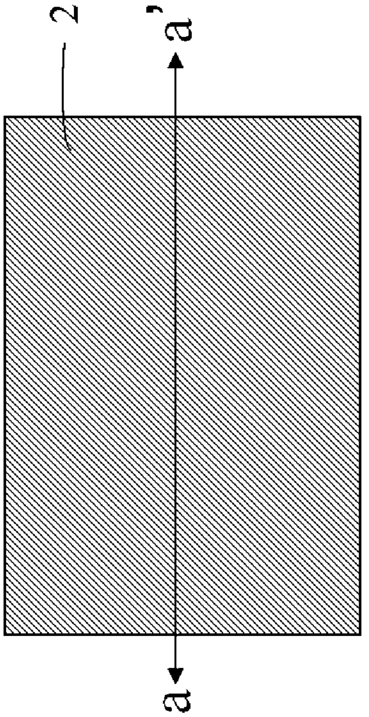
FIGS. 1 to 24 are schematic structural diagrams of a semiconductor structure at each step of a method for fabricating it provided by an embodiment of the present disclosure.

Known from the background technology, the currently fabricated 3D stacked semiconductor structures have the problem of poor morphology, which affects the performance of the semiconductor structures.

Analysis has found that one of the reasons for the poor morphology of the semiconductor structure to affect its performance is that, in the semiconductor structure, many transistors are stacked together, their stacked channel regions have to connect the same one word line. In the process of actually fabricating a semiconductor structure, usually multiple rows of stacked semiconductor columns are formed first, with a sacrificial layer disposed between the semiconductor columns for isolation and support. Moreover, an isolation structure is provided between two adjacent semiconductor columns. In order to expose part of the top and bottom surfaces of the semiconductor columns, the isolation structure needs to be etched first to expose the side surfaces of the semiconductor columns and the sacrificial layer, and then expose the side surface of the sacrificial layer and etch to expose the top surface and the bottom surface of the semiconductor column, so that the word line can surround the side surface of the semiconductor columns in the channel region. However, due to too many stacked semiconductor columns, after etching the isolation structure, the formed through-hole has a relatively large aspect ratio. Due to process limitations, when etching the sacrificial layer exposed by the through-hole, the larger aspect ratio means that more likely that the etched amount of the sacrificial layer exposed at the top of the through-hole is larger, and the etched amount of the sacrificial layer exposed at the bottom of the through-hole is smaller, so that after the etching is completed, the exposed top surface and bottom surface of the top semiconductor columns are large, and the exposed top surface and bottom surface of the semiconductor columns at the bottom are small, which makes the morphology of the semiconductor structure poor and affects the performance of the semiconductor structure.

An embodiment of the present disclosure provides a method for fabricating a semiconductor structure, forming stacked structures arranged at intervals along a first direction on a substrate, and forming an isolation structure between adjacent stacked structures, and forming a semiconductor structure in the isolation structure. The through-hole exposes part of the side surfaces of the semiconductor columns and the first sacrificial layer in the stacked structure. Along the second direction, the width of the bottom of the through-hole is greater than the width of the top of the through-hole, that is, the area of the sacrifice layer exposed at the top of the through-hole is smaller than that of the through-hole area of the sacrificial layer exposed at the bottom; the first sacrificial layer exposed by the through-hole is etched, and part of the first sacrificial layer is removed to expose the top surface and the bottom surface of each semiconductor column, because the area of the first sacrificial layer exposed at the top of the through-hole is smaller than the area of the first sacrificial layer exposed at the bottom of the through-hole, so that the etching amount of the first sacrificial layer at the top of the through-hole will not be too large, and the etching amount of the first sacrificial layer at the bottom will not be too small, thereby It can compensate the problem that the etching degree of the sacrificial layer on the top of the through-hole is large and the etching degree of the first sacrificial layer at the bottom of the through-hole is small due to process reasons, so that each semiconductor columns finally exposed has the same or similar shape.

The various embodiments of the present disclosure will be described in detail below in conjunction with the accompanying drawings. However, those of ordinary skill in the art can understand that, in each embodiment of the present disclosure, many technical details are provided for readers to better understand the embodiments of the present disclosure. However, even without these technical details and various changes and modifications based on the following embodiments, the technical solutions claimed in the embodiments of the present disclosure can be realized.

The method for fabricating a semiconductor structure includes: providing a substrate, and forming a stacked structure arranged at intervals along a first direction on the substrate, the stacked structure including first sacrificial layers and semiconductor columns stacked alternately along a vertical direction.

The material of the substrate is a semiconductor material, and in some embodiments, the substrate is a silicon substrate. In some other embodiments, the substrate may also be a germanium substrate, a silicon germanium substrate, a silicon carbide substrate or a silicon-on-insulator substrate.

The semiconductor columns is used to form the semiconductor channel of the transistor, and in some embodiments, the material of the semiconductor columns may be the same as that of the substrate. In one example, the material of the semiconductor columns may be silicon. The first sacrificial layer is disposed between two adjacent semiconductor columns and is in contact with the two adjacent semiconductor columns. On the one hand, it plays a role in supporting the semiconductor columns; on the other hand, the first sacrificial layer covers the surface of the semiconductor columns. Space is reserved for subsequent formation of other conductive structures. Specifically, when part of the first sacrificial layer is subsequently removed, the remaining first sacrificial layer acts as a support, and the removed part of the first sacrificial layer exposes the top and bottom surfaces of the semiconductor columns, thereby providing enough space for forming other conductive structures.

Figure 2:
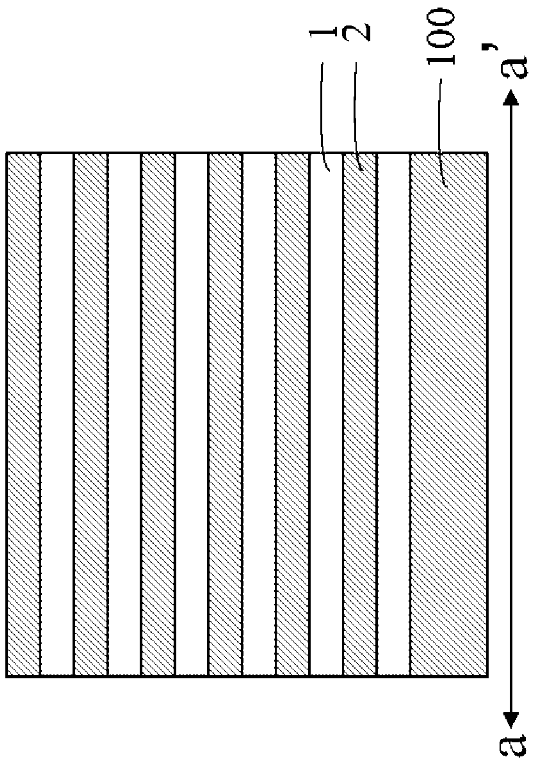

In some embodiments, the method for forming multiple rows of sequentially stacked first sacrificial layers and semiconductor columns may include:

FIG. 1 is a schematic diagram of a top view structure at the step of forming an initial semiconductor layer and an initial sacrificial layer in the method for fabricating a semiconductor structure; FIG. 2 is a cross-sectional structure along the line aa' cutline in FIG. 1.

Referring to FIG. 1 and FIG. 2, an initial semiconductor layer 1 and an initial sacrificial layer that can be stacked sequentially along the direction away from the substrate 100 are formed on the substrate 100. In some embodiments, the substrate 100 is a silicon substrate, the material of the initial semiconductor layer 1 is silicon, and the material of the initial sacrificial layer 2 may be silicon germanium. It is not difficult to find that the initial semiconductor layer 1, the initial sacrificial layer 2 and the substrate 100 have the same element silicon, based on this, the initial semiconductor layer 1 and the initial sacrificial layer 2 at intervals can be formed on the surface of the substrate 100 by using an epitaxial process, so that It is easier to grow silicon germanium by using silicon in the silicon substrate, so that the fabrication process is simple, and the boundary between the formed initial sacrificial layer 2 and the initial semiconductor layer 1 is clear. The surface of the surface is relatively smooth, which is beneficial to the subsequent formation of the first sacrificial layer, and when the exposed first sacrificial layer is etched and removed, the first sacrificial layer can be removed relatively cleanly, so that the contact between other conductive structures subsequently formed on the surface of the semiconductor columns and the semiconductor columns is good, thereby improving the performance of the semiconductor structure.

After forming the initial semiconductor layer 1 and the initial sacrificial layer, the initial semiconductor layer 1 positioned on the top surface is patterned to define the opening of the isolation groove (not shown), and the isolation groove is used for subsequent formation of the isolation structure, to isolate two adjacent columns of semiconductor columns; etch the patterned initial semiconductor columns until the surface of the substrate 100 is exposed, so as to form multiple rows of first sacrificial layers and semiconductor columns stacked in sequence, and the bottom surface of the isolation groove exposes part of the top surface of the substrate 100. The sides of the isolation trench expose the stacked semiconductor columns and the sides of the first sacrificial layer.

Each semiconductor columns is used to form at least one transistor. In each row of stacked semiconductor columns and the first sacrificial layer, the number of semiconductor columns is multiple, which is beneficial to realize the transistor in a direction perpendicular to the surface of the substrate 100. The multi-layer stacking is beneficial to integrate a larger number of transistors in a limited space, increase the integration density of semiconductor structures, and achieve smaller volume integration while ensuring better performance. In some embodiments, the semiconductor columns has a channel region for use as a channel of a transistor. In some embodiments, the semiconductor columns further includes: doped regions disposed on both sides of the channel region, wherein one doped region is used as a source of the transistor, and the other doped region is used as a drain of the transistor. In some embodiments, the type of doping ions in the doped region can be the same as that of the channel region, so that the type of transistor formed is joint free transistor, for example, the type of doping ions in the first channel region can be P-type, the dopant ion type in the source region and the drain region may be P-type. In some other embodiments, the type of doping ions in the doped region is different from the type of doping ions in the channel region, so that the type of transistor formed is a junction transistor, for example, the type of doping ions in the first channel region can be P-type, and the dopant ion type in the source region and the drain region can be N-type.

In some embodiments, the initial semiconductor layer 1 can be doped before forming the semiconductor columns, so that after the initial semiconductor layer 1 is etched to form a plurality of semiconductor columns distributed at intervals, each semiconductor columns has a first channel region, a source region and a drain region. In other embodiments, after the semiconductor columns are formed, a doping process may be performed on the semiconductor columns to form the first channel region and source regions and drain regions disposed on both sides of the first channel region. Wherein, the doping process may be any one of ion implantation or thermal diffusion.

Figure 3:
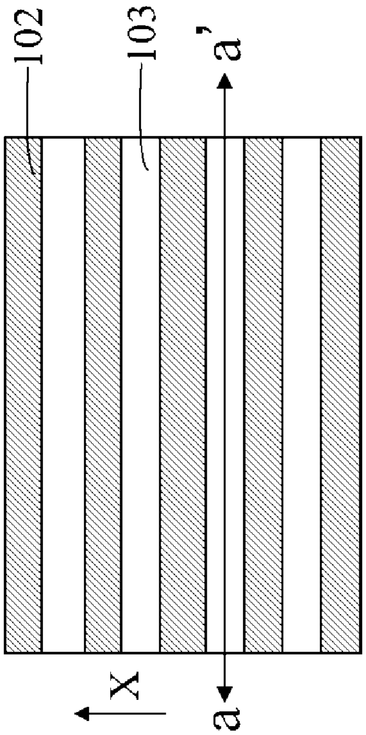
Figure 4:
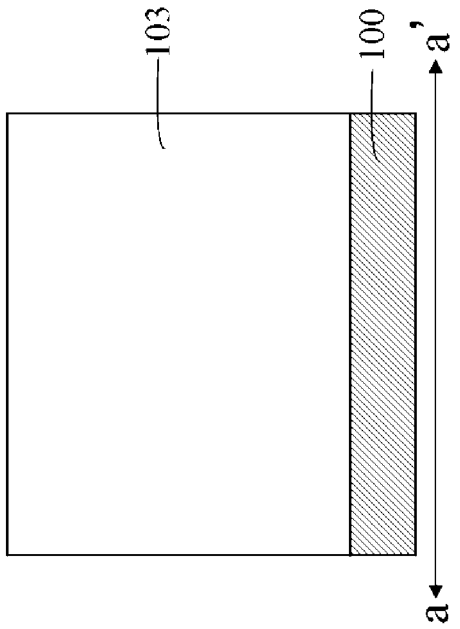

Referring to FIG. 3 and FIG. 4, an isolation structure 103 is formed, and the isolation structure 103 is disposed between adjacent stack structures along the first direction X. The first direction X is the arrangement direction of the rows of semiconductor columns 102. The isolation structure 103 is used to isolate the adjacent semiconductor columns 102. In addition, when part of the isolation structure 103 is subsequently removed to expose part of the side surfaces of the first sacrificial layer 101, the remaining part of the isolation structure 103 can also serve as a mask to prevent the etching process from corresponding to the semiconductor columns that do not need to expose the top surface and the bottom surface. The first sacrificial layer 101 and the semiconductor columns 102 have process damage.

In some embodiments, the material of the isolation structure 103 may be silicon oxide. The isolation structure 103 may be formed in the isolation trench by a deposition process, for example, any one of atomic layer deposition or thermal oxidation process may be used.

Referring to FIG. 5 to FIG. 12, the isolation structure 103 is etched to form a through-hole 105, the through-hole 105 exposes part of the surface of the substrate 100, and also exposes the side of each stack structure, along the second direction Y. The width of the bottom of the through-hole 105 is greater than the width of the top of the through-hole 105, and the second direction Y is perpendicular to the first direction X. That is to say, the area of the sacrificial layer exposed at the top of the through-hole 105 is smaller than the area of the sacrificial layer exposed at the bottom of the through-hole 105, so that when the etching process is performed on the first sacrificial layer 101 exposed in the through-hole 105, in the etching process, the etching amount of the first sacrificial layer 101 at the top of the through-hole 105 should not be too large, and the etching amount of the first sacrificial layer 101 at the bottom of the through-hole 105 should not be too small, so as to compensate for the excessive height-to-depth ratio of the through-hole 105. The problem that the etching degree of the first sacrificial layer 101 at the top of the through-hole 105 is relatively large, and the degree of etching of the first sacrificial layer 101 at the bottom of the through-hole 105 is relatively small. In some embodiments, the through-hole 105 may expose part of the side of the channel region in each semiconductor columns 102. Since the semiconductor columns 102 and the first sacrificial layer 101 are stacked with each other, the first sacrificial layer 101 exposed by the through-hole Also only the first sacrificial layer 101 corresponding to part of the channel region. In this way, after subsequent etching of the first sacrificial layer 101 exposed by the through-hole 105, process damage to the first sacrificial layer 101 corresponding to the non-channel region and the semiconductor columns 102 can be prevented from being caused by the etching process. And the through-hole 105 only exposes part of the channel region in each semiconductor columns 102, because, due to process reasons, the actual etching process will also etch part of the first sacrificial layer 101 that is not exposed on the surface. In order to prevent the subsequently formed word line from covering part of the surface of the semiconductor columns 102 in the non-channel region, thereby adversely affecting the performance of the semiconductor structure, the formed through-hole 105 only exposes part of the channel region in each semiconductor columns 102, so that the problem of exposing the side surface of the semiconductor columns 102 corresponding to the non-channel region after etching the first sacrificial layer 101 exposed by the through-hole 105 can be avoided.

It can be understood that, by controlling the width of the top of the through-hole 105, to limit the etching amount of the first sacrificial layer 101 on the top of the through-hole 105 by the etching process, by controlling the width of the bottom of the through-hole 105 to be larger. Therefore, the etching amount of the first sacrificial layer 101 at the bottom of the through-hole 105 is increased by the etching process. It can be seen that, only by controlling the ratio of the width of the top of the through-hole 105 to the width of the bottom of the through-hole 105, the etching amount of the first sacrificial layer 101 on the top of the through-hole 105 and the impact of the etching process on the first sacrificial layer 101 at the top of the through-hole 105 can be balanced. The amount of etching of the first sacrificial layer 101 at the bottom of the through-hole 105 is such that the shape of the channel region exposed by each semiconductor columns 102 is the same or similar in the direction from the top of the through-hole 105 to the bottom of the through-hole 105, so that the subsequent formation, the area of the channel region of each semiconductor columns 102 covered by the word line is the same or similar, so that the control ability of the word line on the channel region of each semiconductor columns 102 is the same or similar, thereby improving the overall performance of the semiconductor structure. Based on this, in some embodiments, the ratio of the width of the top of the through-hole 105 to the width of the bottom of the through-hole 105 ranges from 0.75 to 0.95. Within this range, after the etching process etches the first sacrificial layer 101 exposed by the through-hole 105, the shape of the channel region exposed by each semiconductor columns 102 is the same or similar. Specifically, in some embodiments, the difference between the width of the top of the through-hole 105 and the width of the bottom of the through-hole 105 may range from 0.5 nm to 3 nm.

Figure 5:
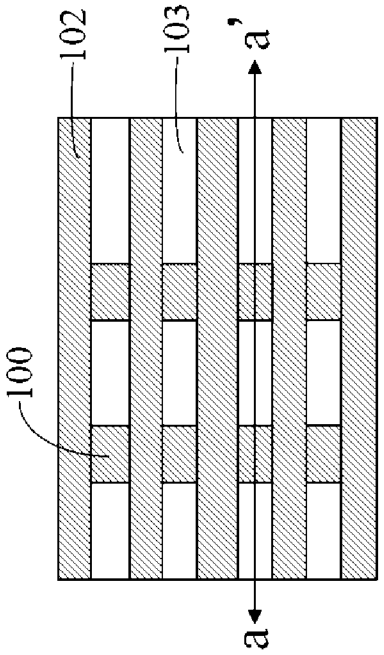
Figure 6:
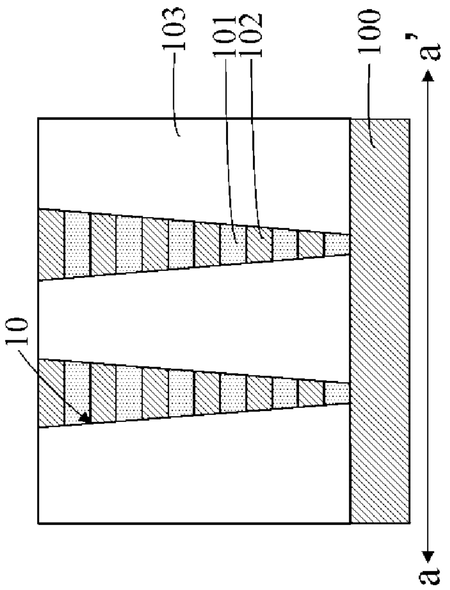

In some embodiments, the method of forming the through-hole 105 includes:

Referring to FIG. 5 and FIG. 6. FIG. 6 is a cross-sectional view of the aa' cutline in FIG. 5 formed in the method for fabricating a semiconductor structure provided by an embodiment of the present disclosure. The isolation structure 103 is etched. In order to form two grooves 10 spaced along the second direction in the isolation structure 103, the grooves 10 expose part of the surface of the substrate 100, and also expose part of the side of the stack structure extending along the second direction, in the second direction Y Above, the width of the top of the groove 10 is greater than the width of the bottom of the groove 10. The side wall of the groove 10 also exposes the sides of two adjacent columns of semiconductor columns 102 and the side of the first sacrificial layer 101. The groove 10 is used for subsequent formation of the supporting layer structure, and the supporting layer structure can be used as a mask layer for forming the through-hole 105. Specifically, in some embodiments, the method for forming the groove 10 may include: performing a patterning process on the top surface of the isolation structure 103 to define the opening of the groove 10; performing an etching process on the patterned isolation structure 103 until Part of the top surface of the substrate 100 is exposed to form the groove 10.

Figure 7:
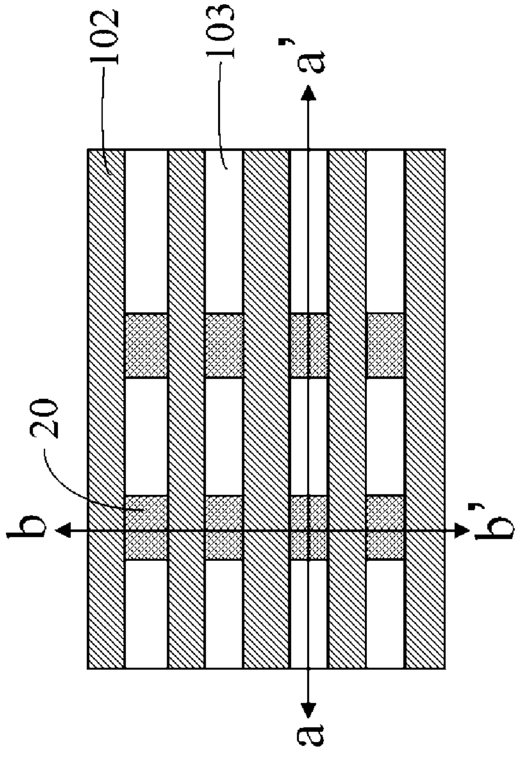
Figure 8:
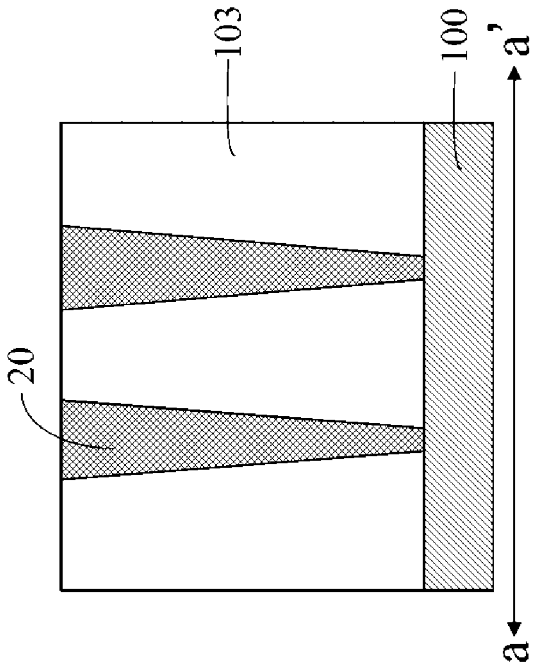

Referring to FIG. 7 and FIG. 8, FIG. 8 is a cross sectional view along aa' cutline in FIG. 7, a support layer structure 20 is formed in the groove 10, and the sides of the two support layer structures 20) are in contact with the isolation structure 103. The material of the support layer structure 20 is different from that of the isolation structure 103, so that when the isolation structure 103 disposed between the two support layer structures 20 is subsequently etched, the space between the first sacrificial layer 101 and the support layer structure 20 can be used. The etching selectivity ratio is such that the etching process only etches the isolation structure 103 disposed between the two supporting layer structures 20 without etching the supporting layer structure 20. The side wall of the formed support layer structure 20 is in contact with the isolation structure 103, that is to say, the support layer structure 20 fills the groove 10, so that the shape of the support layer structure 20 is consistent with the shape of the groove 10, so, only need to control the shape of the formed groove 10 can control the shape of the supporting layer structure 20. When removing the isolation structure 103 between the two support layer structures 20 to form the through-hole 105, the shape of the formed through-hole 105 matches the shape of the support layer structure 20, that is, by controlling the shape of the groove 10 to define the shape of the formed through-hole 105 in advance.

Specifically, in some embodiments, the material of the supporting layer structure 20 may be silicon nitride, and a deposition process may be used to form the supporting layer structure 20 in the groove 10.

Figure 9:
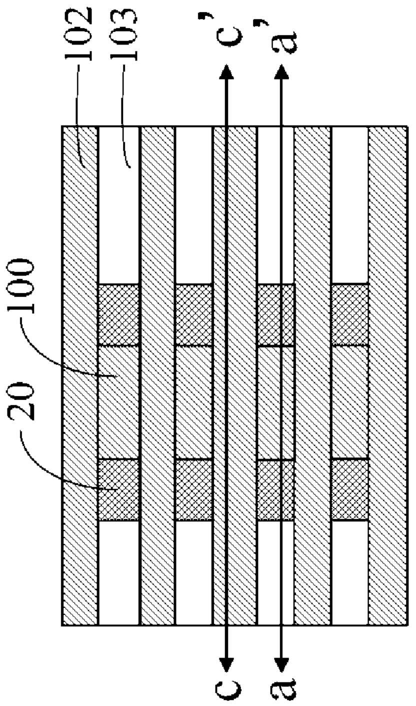
Figure 10:
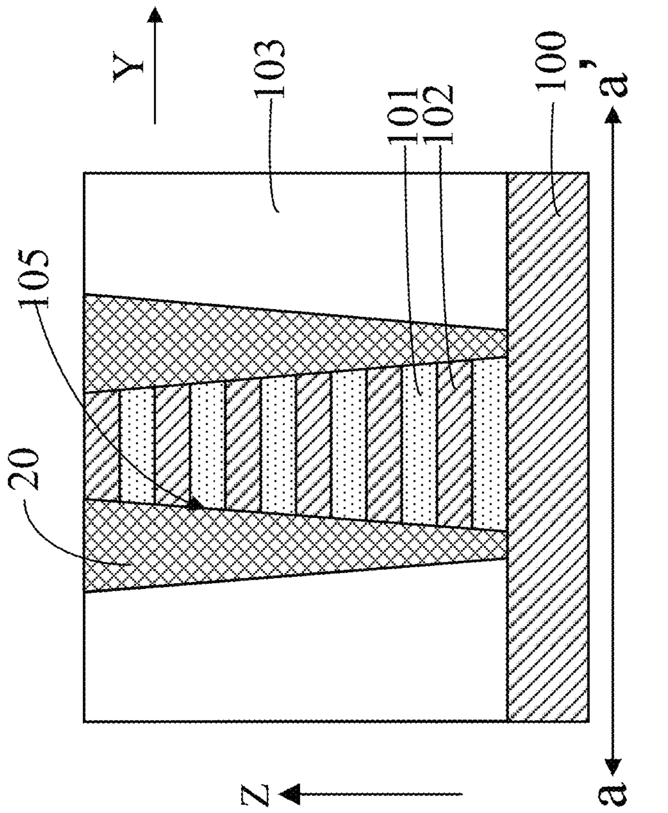
Figure 11:
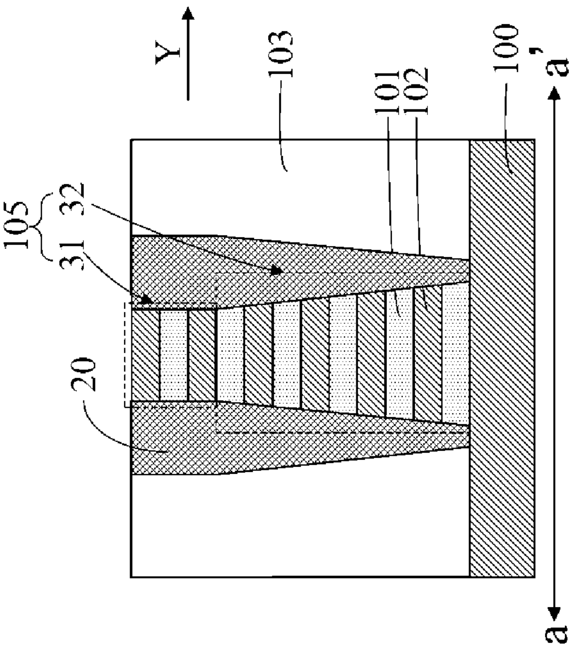
Figure 12:
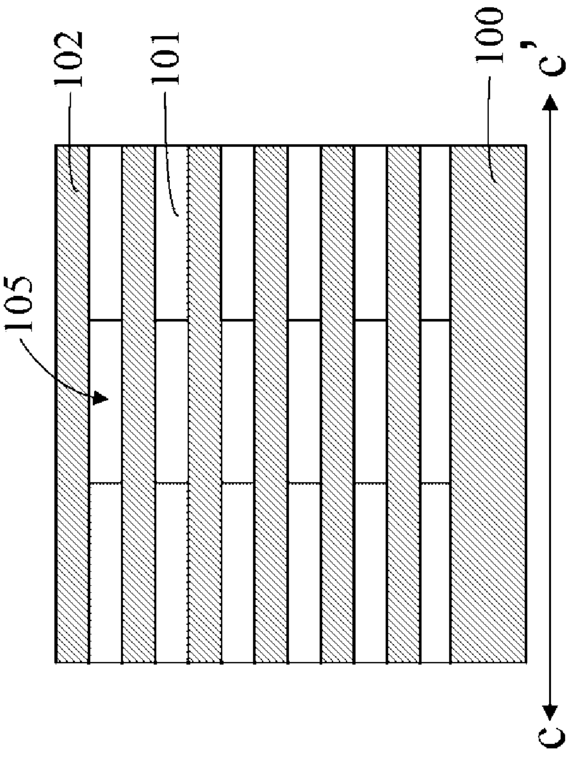

Referring to FIGS. 9 to 12, wherein, FIG. 10 is a schematic diagram of a cross-sectional structure corresponding to the formation of a through-hole in a method for fabricating a semiconductor structure provided by an embodiment of the present disclosure. FIG. 10 is a cross-sectional view along the aa' line of FIG. 9. FIG. 11 is a schematic diagram of a cross-sectional structure corresponding to the formation of a through-hole in another method for fabricating a semiconductor structure provided by an embodiment of the present disclosure. FIG. 11 is a cross-sectional view along the aa' cutline in FIG. 9, and FIG. 12 is a cross-sectional view in the cc' direction in FIG. 9 In the cross-sectional view, the isolation structure 103 disposed between the two support layer structures 20 is etched to expose the side of the support layer structure 20 to form a through-hole 105. Since the top width of the groove 10 is greater than the bottom width of the groove 10, the top width of the formed support layer structure 20 is greater than the bottom width, so that the top width of the isolation structure 103 between the two support layer structures 20 is smaller than that between the two support layer structures 20. The bottom width of the isolation structure 103 between the supporting layer structures 20. After the isolation structure 103 disposed between the two supporting layer structures 20 is removed by etching, the width of the top of the through-hole 105 is smaller than the width of the bottom. That is to say, the support layer structure 20 actually functions as a mask layer for defining the shape of the formed through-hole 105 in advance. In some embodiments, referring to FIG. 10, first sacrificial layers and semiconductor columns stacked alternately along a vertical direction Z perpendicular to a surface of the substrate 100. The vertical direction Z is perpendicular to the second direction Y.

In some embodiments, the isolation structure 103 disposed between two adjacent support layer structures 20 may be removed by etching dry etching or wet etching process.

Referring to FIG. 6, in some embodiments, the cross-sectional shape of the groove 10 in the vertical first direction is an inverted trapezoid. It can be understood that due to the large number of semiconductor columns 102 stacked on the substrate 100, the height of the top surface of the formed isolation structure 103 is relatively large, that is, the height of the formed groove 10 is relatively large. Due to process reasons, the amount of etching on the top surface of the isolation structure 103 will be greater than the amount of etching on the bottom of the isolation structure 103, so that in the direction along the top of the isolation structure 103 to the bottom of the isolation structure 103, the width of the groove 10 gradually decreases, that is, forming the cross-sectional shape of the groove 10 is an inverted trapezoid. In this way, the cross-sectional shape of the supporting layer structure 20 subsequently formed in the groove 10 is also an inverted trapezoid, so that the shape of the formed through-hole 105 is trapezoidal, that is, in the direction from the top of the through-hole 105 to the bottom of the through-hole 105, the width of the through-hole 105 gradually increases. In this way, in the direction from the top of the through-hole 105 to the bottom of the through-hole 105, the etching amount of each first sacrificial layer 101 can be gradually compensated to improve the consistency of the shape of the channel region exposed by each semiconductor columns 102.

In some embodiments, along the second direction Y, the ratio of the width of the top of the groove 10 to the width of the bottom of the groove 10 ranges from 1.05 to 1.25. Because the shape of the groove 10 is controlled, the shape of the formed supporting layer structure 20 can be controlled, and the supporting layer structure 20 is used as a mask layer to define the shape of the formed through-hole 105 in advance, that is, to control the formed concave shape. The shape of the groove 10, that is, the shape of the formed through-hole 105 can be adjusted. Therefore, controlling the ratio of the width of the top of the groove 10 to the width of the bottom of the groove 10 within this range can make the shape of the formed through-hole 105 meet expectations.

Referring to FIG. 11, in some embodiments, the through-hole 105 includes: a first through-hole 31 and a second through-hole 32 connected to each other, and the first through-hole 31 is disposed on the side of the second through-hole 32 away from the substrate 100, the cross-sectional shape of the first through-hole 31 perpendicular to the first direction X is rectangular, and the cross-sectional shape of the second through-hole 32 perpendicular to the first direction X is trapezoidal. That is to say, along the second direction Y, the width of the first through-hole 31 close to the top of the isolation structure 103 is constant, and the width of the top of the second through-hole 32 near the bottom of the isolation structure 103 is smaller than the width of the bottom. It can be understood that, since the depth of the position of the first through-hole 31 near the top of the isolation structure 103 is relatively small, that is, the height-to-depth ratio of the first through-hole 31 is relatively small, therefore, the etching process has a great impact on the top of the first through-hole 31. There is little difference between the etching amount and the etching amount on the bottom of the first through-hole 31. Since the position of the second through-hole 32 near the bottom of the isolation structure 103 is relatively deep, that is, the height-to-depth ratio of the second through-hole 32 is relatively large, therefore, the engraving of the first sacrificial layer 101 exposed on the top of the second through-hole 32. The etching amount and the etching amount of the first sacrificial layer 101 exposed at the bottom of the second through-hole 32 are easily affected by the etching process. Therefore, setting the cross-sectional shape of the second through-hole 32 as a trapezoid can compensate for the difference in the amount of etching between the first sacrificial layer 101 and the supporting layer structure 20, so that in the etching process for each layer of the first sacrificial layer, the etching amount of 101 is close to or the same.

Figure 13:
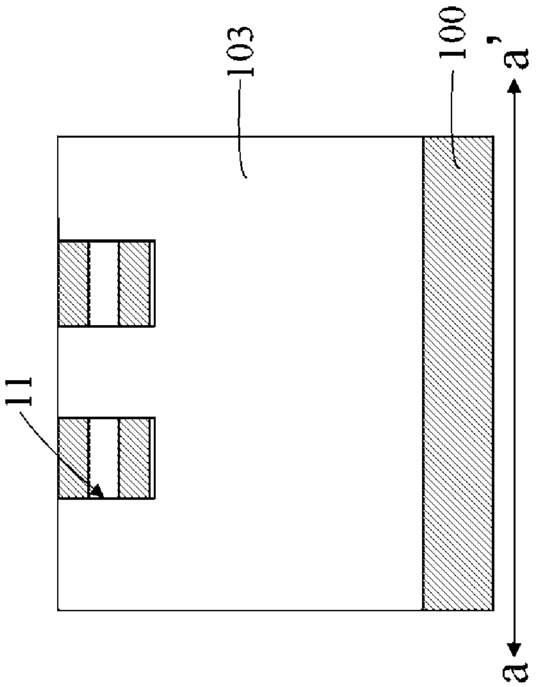

In some embodiments, the method of forming the through-hole 105 includes:

Referring to FIG. 13, FIG. 13 is a cross-sectional view along the aa' cutline, and an etching process is performed on the isolation structure 103 to form two first grooves 11 spaced along the second direction in the isolation structure 103, the first groove 11 exposes part of the isolation structure 103, and the cross-sectional shape of the first groove 11 perpendicular to the first direction is a rectangle. That is to say, only part of the isolation structure 103 is etched, so that the depth of the formed first groove 11 is not too large, so that the depth of the first through-hole formed subsequently is not too large, preventing etching of the first sacrificial layer 101 exposed by the first through-hole affected by the high aspect ratio.

Specifically, in some embodiments, the method for forming the first groove 11 may include: performing a patterning process on the top surface of the isolation structure 103 to define the opening of the first groove 11; performing an etching process on the isolation structure 103, wherein this etch goes to form a first groove 11 with a preset depth.

Figure 14:
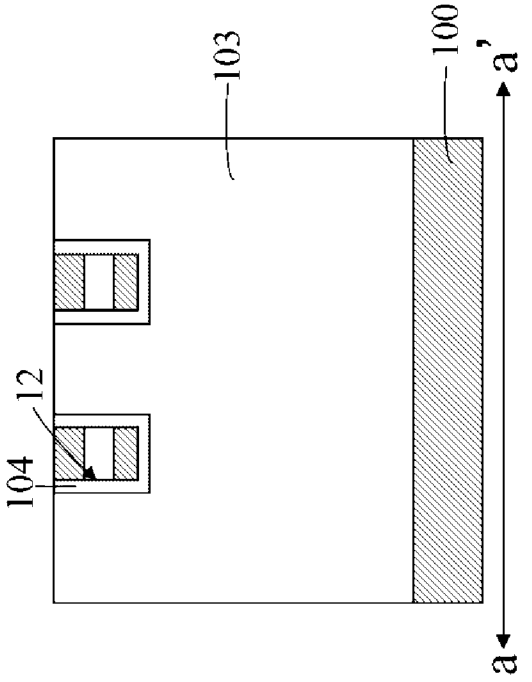
Figure 17:
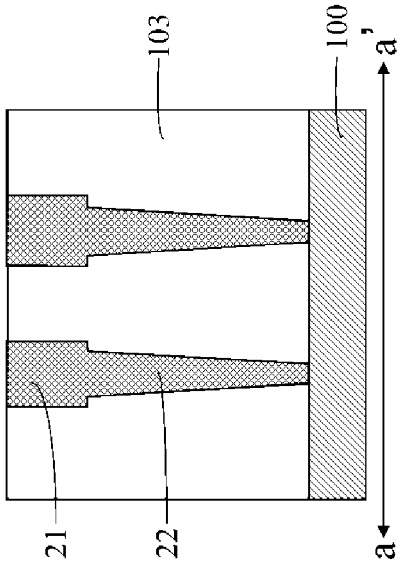
Figure 18:
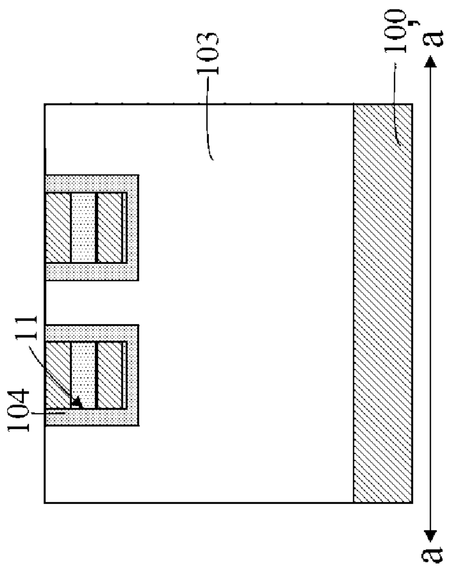

Referring to FIG. 14 and FIG. 18. FIG. 14 to FIG. 16 and FIG. 18 are cross-sectional views of the structure along the aa' cutline. FIG. 17 is a cross-sectional view along the aa' cutline, form a mask layer 104 on the side wall of the first groove 11, the formed mask layer 104 is used to protect the first groove 11, thereby preventing subsequent etching of the isolation structure 103 exposed at the bottom of the first groove 11 to form the second groove 13, the first side wall of the groove 11 continues to be etched, thereby causing damage to the shape of the first groove 11.

Figure 15:
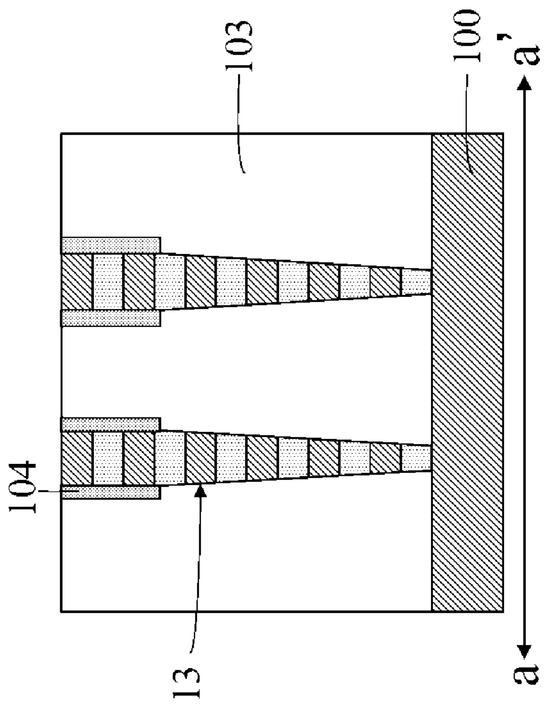
Figure 19:
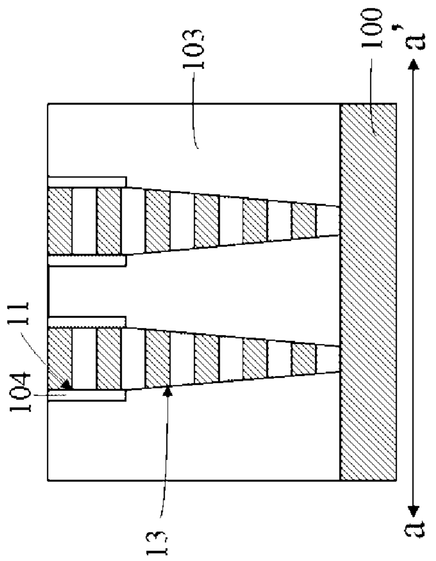

Referring to FIG. 15 and FIG. 19. FIG. 19 is another cross-sectional view along the aa' cutline, etching the isolation structure 103 exposed at the bottom of the first groove 11 to form a second groove 13, the second groove 13 is connected with the first groove 11, the cross-sectional shape of the second groove 13 running perpendicular to the first direction X is an inverted trapezoid. Since the second groove 13 is arranged close to the substrate 100, the depth of the position where the second groove 13 is disposed is relatively large, that is, the aspect ratio of the formed second groove 13 is large. Therefore, the etching of the second groove 13 It will be affected by the high aspect ratio, that is, the amount of etching at the top of the second groove 13 will be greater than the amount of etching at the bottom of the second groove 13, so that the cross-sectional shape of the formed second groove 13 is an inverted trapezoid.

Specifically, in some embodiments, along the second direction Y, the width of the first groove 11 is greater than the top width of the second groove 13, after forming the first groove 11, the method includes:

Referring to FIG. 14, a mask layer 104 is formed on the surface of the isolation structure 103 exposed on the side wall of the first groove 11 by using a deposition process, and the mask layer 104 encloses the first sub-groove 12, along the second direction Y, the width of the first sub-groove 12 is smaller than the width of the first groove 11. The mask layer 104 is disposed on the surface of the isolation structure 103 facing the center of the first groove 11 in the first groove 11, and the mask layer 104 covers the entire surface of the isolation structure 103 exposed on the side wall of the first groove 11, so that the mask layer 104 protects the entire side wall of the first groove 11, so that the complete shape of the first groove 11 is maintained during the process of forming the second groove 13.

In some embodiments, a deposition process may be used to form the mask layer 104 on the surface of the isolation structure 103 exposed on the side wall of the first groove 11, so that the process of forming the mask layer 104 is relatively simple. The material of the mask layer 104 is different from the material of the isolation structure 103. In this way, the etching selectivity ratio of the mask layer 104 and the isolation structure 103 can be used in the etching process, so during the process subsequently etching the isolation structure 103 to form the second groove 13, the mask layer 104 will not be etched, so the mask layer 104 plays a better protective role. In some embodiments, the material of the mask layer 104 may be a low-k dielectric material.

In some embodiments, after the mask layer 104 is deposited on the surface of the isolation structure 103 exposed by the first groove 11, the mask layer 104 will also be formed at the bottom of the first groove 11 at the same time. Therefore, before forming the second the groove 13, the mask layer 104 at the bottom of the first groove 11 needs to be removed to expose the top surface of the isolation structure 103.

Referring to FIG. 15, the isolation structure 103 exposed at the bottom of the first sub-groove 12 is etched to form a second groove 13. Along the second direction Y, the width of the top of the second groove 13 is the same as that of the first sub-groove 13. The width of the sub-grooves 12 is equal. Since the mask layer 104 is additionally deposited on the surface of the isolation structure 103, the width of the first sub-groove 12 surrounded by the mask layer 104 is smaller than the width of the first groove 11. When the mask layer 104 is used as a mask to etch the top surface of the isolation structure 103 exposed in the first sub-groove 12, it will be etched along the topography of the bottom of the first sub-groove 12, so that the formed width of the top of the second groove 13 is consistent with the width of the first sub-groove 12, so that the width of the second groove 13 finally formed is smaller than the width of the first groove 11.

Figure 16:
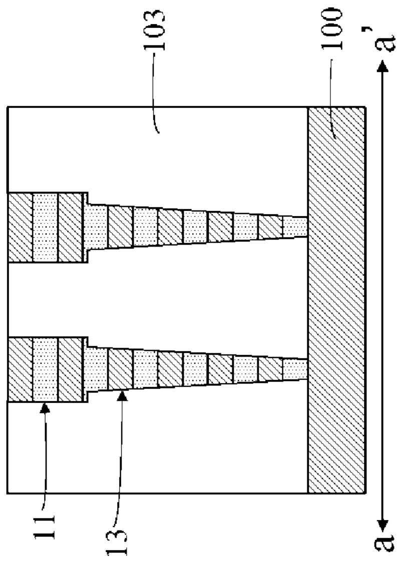

Referring to FIG. 16, the mask layer 104 is removed. Since the mask layer 104 is additionally deposited on the surface of the isolation structure 103 exposed by the first groove 11, the mask layer 104 needs to be removed. After removing the mask layer 104, the width of the top of the second groove 13 will be smaller than the width of the bottom of groove 11.

In other embodiments, along the second direction Y, the width of the first groove 11 is equal to the width of the top of the second groove 13, after forming the first groove 11, the method includes:

Referring to FIG. 18, the isolation structure 103 exposed on the side wall of the first groove 11 is processed to convert the isolation structure 103 exposed on the side wall of the first groove 11 into a mask layer 104 with a predetermined thickness. That is to say, the mask layer 104 is not additionally formed on the surface of the isolation structure 103 exposed by the first groove 11, but the isolation structure 103 exposed on the side wall of the first groove 11 is converted into a mask layer 104, so that A mask layer 104 is formed on the side wall of the groove 11. In this way, during the subsequent process of forming the second groove 13, since the isolation structure 103 exposed by the first groove 11 has been transformed into the mask layer 104, the etching process will not damage the side wall of the first groove 11, etch, so that the complete shape of the first groove 11 can be maintained.

In some embodiments, the isolation structure 103 is silicon oxide, and processing the isolation structure 103 exposed on the side wall of the first groove 11 includes: performing nitriding treatment on the isolation structure 103 exposed on the side wall of the first groove 11, to form silicon nitride with a predetermined thickness. Specifically, in some embodiments, the method for performing nitriding treatment may include: a gas nitriding process, for example, nitrogen gas may be passed through, so that the nitrogen gas reacts with silicon oxide to form silicon nitride. Specifically, in some embodiments, a hard mask layer may be formed on the top surface of the isolation structure 103 to only expose the isolation structure 103 on the side wall of the first groove 11 and the isolation structure 103 on the bottom of the first groove 11. Next, nitrogen gas is passed into the first groove 11, so that the nitrogen gas reacts with the isolation structure 103 exposed on the side wall of the first groove 11 and the bottom, so that the isolation structure 103 on the side wall and bottom of the first groove 11 is transformed into silicon nitride.

In some embodiments, before forming the second groove 13, the silicon nitride at the bottom of the first groove 11 needs to be removed to expose the isolation structure 103 at the bottom of the first groove 11.

Referring to FIG. 19, the isolation structure 103 exposed at the bottom of the first groove 11 is etched to form a second groove 13. Along the second direction Y, the width of the top of the second groove 13 is the same as that of the first groove 11. Since the isolation structure 103 exposed by the first groove 11 is transformed into the mask layer 104, the mask layer 104 is not additionally deposited on the surface of the isolation structure 103 exposed by the first groove 11. Therefore, in the process of forming the second groove 13, the etching process will still etch along the topography of the bottom of the first groove 11 to form the second groove 13. The top side wall of the first groove 11 is joined with the bottom side wall of the first groove 11, so that the side wall between the first groove 11 and the second groove 13 is joined. In this way, the side walls at the joining point of the first through-hole and the second through-hole to be formed later have a smooth transition, so that when the first sacrificial layer 101 exposed by the first through-hole and the second through-hole is etched, it is disposed at the first through-hole. The difference in etched amount between the first sacrificial layer 101 at the joining point of the through-hole and the second through-hole is small, which is beneficial to improve the consistency of the shape of the formed channel region.

Figure 20:
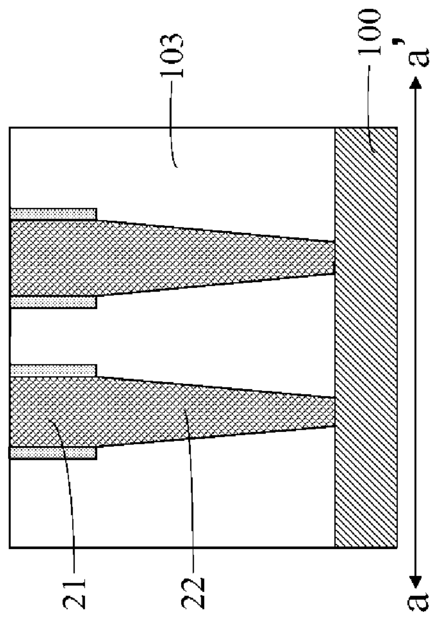

Referring to FIG. 17 and FIG. 20. FIG. 20 is a cross sectional view of the structure along the aa' cutline, the first sub-support layer 21 is formed in the first groove 11, and the second sub-support layer 22 is formed in the second groove 13. The first sub-support layer 21 is filled in the first groove 11, so that the shape of the formed first sub-support layer 21 is consistent with the shape of the first groove 11, that is, the cross-sectional shape of the first sub-support layer 21 is rectangular. The second sub-support layer 22 is filled in the second groove 13, so that the shape of the second sub-support layer 22 is consistent with the shape of the second groove 13, that is, the cross-sectional shape of the second sub-support layer 22 is an inverted trapezoid. Specifically, a deposition process may be used to form the first sub-support layer 21 in the first groove 11 and to form the second sub-support layer 22 in the second groove 13.

Etching the isolation structure 103 between the two first sub-support layers 21 to form a first through-hole; etching the isolation structure 103 between the two second sub-support layers 22 to form a second through-hole, the first through-hole connects with the second through-hole to form one through-hole. Since the cross-sectional shapes of the two first sub-support layers 21 are rectangular, when the isolation structure 103 between the two first sub-support layers 21 is etched to form the first through-hole, the shape of the first through-hole is different from that of the first sub-support layer. The shape of the supporting layer 21 matches, so that the shape of the first through-hole is also rectangular. The cross-sectional shape of the second sub-support layer 22 is an inverted trapezoid, so that the shape of the second through-hole matches the shape of the second sub-support layer 22 and is trapezoidal.

Considering that the cross-sectional shape of the first through-hole is rectangular, that is, the width of the top of the first through-hole is equal to the width of the bottom, therefore, the formation of the first through-hole will not affect the exposed first sacrificial layer 101 at the top of the first through-hole. The amount of etching between the first sacrificial layer 101 exposed at the bottom of the first through-hole is compensated. Therefore, it is necessary to set the height of the first through-hole to be small to prevent etching due to the large aspect ratio of the first through-hole. There is a problem that the etching amount of each first sacrificial layer 101 exposed by the first through-hole is different in the process. Based on this, in some embodiments, in a direction perpendicular to the substrate 100, the ratio of the height of the first through-hole to the height of the second through-hole ranges from (0.1 to 0.3. Within this range, the aspect ratio of the first through-hole is not too large, so that the difference between the etching amount of each first sacrificial layer 101 exposed by the first through-hole in the etching process is small, so that Each channel region exposed by the semiconductor columns 102 in the first through-hole has a similar shape, so that the area of the channel region of each semiconductor columns 102 covered by the subsequently formed word line is similar, so that the word line. The ability to control the channel region of each semiconductor columns 102 is close to improve the overall performance of the semiconductor structure.

In other embodiments, the method for forming groove 10 may also include:

The modification process is performed on the isolation structure 103. In the direction along the isolation structure 103 to the substrate 100, the etching ratio of the etching process on the top of the isolation structure 103 is greater than that on the bottom of the isolation structure 103. Specifically, in some embodiments, the modification process may include: performing a doping process on the isolation structure 103 to implant dopant ions into the isolation structure 103, and controlling the concentration of the dopant ions in the isolation structure 103, thereby regulating the etch selectivity ratio of the etching process to the top and bottom of the isolation structure 103. Specifically, in some embodiments, when the material of the isolation structure 103 is silicon oxide, boron can be doped into the isolation structure 103, wherein the doping concentration of the boron element at the top of the isolation structure 103 is lower than the doping concentration of boron element at the bottom of the isolation structure 103.

An etching process is performed on the isolation structure 103 to form the groove 10. Since the etching selectivity ratio of the etching process to the top of the isolation structure 103 is greater than the etching selectivity ratio to the bottom, the etching amount of the etching process to the top of the isolation structure 103 is greater than the etching amount to the bottom, so that the formed groove's top width of 10 is greater than the bottom width, so that the top width of the formed through-hole 105 is smaller than the bottom width of the through-hole 105.

In some embodiments, in the direction along the isolation structure 103 to the substrate 100, the etching ratio of the isolation structure 103 by the etching process gradually decreases. In this way, during the etching process of the isolation structure 103, in the direction along the isolation structure 103 to the substrate 100, the etching amount of the isolation structure 103 gradually decreases, so that the cross-sectional shape of the formed groove 10 is inverted trapezoid. Further, the shape of the formed through-hole 105 is controlled to be trapezoidal.

Figure 21:
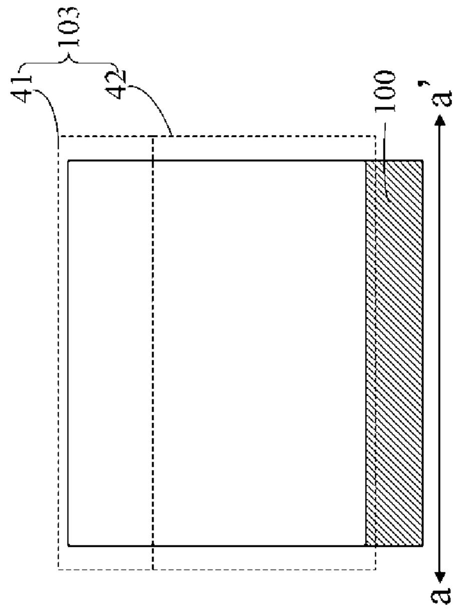
Figure 22:
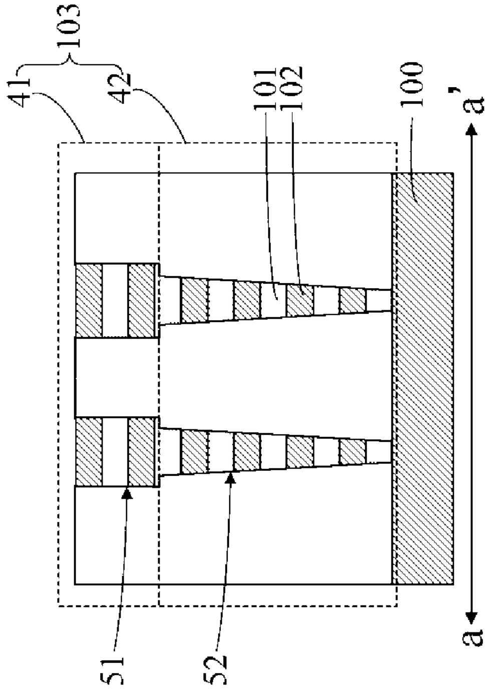
Figure 23:
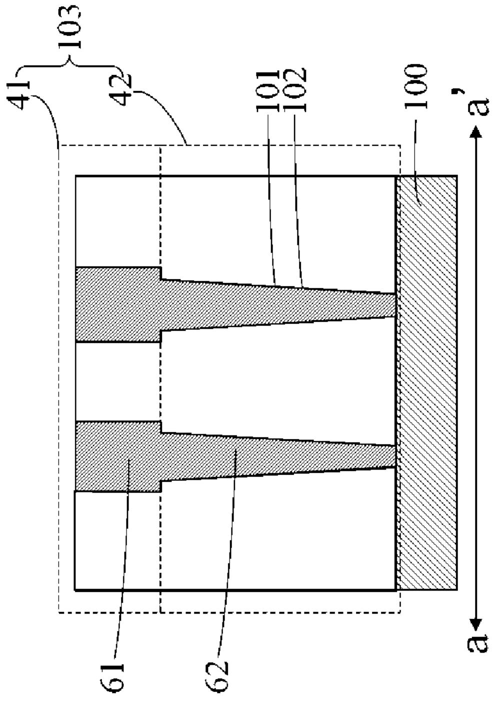

In some other embodiments, the through-hole 105 includes: a first through-hole and a second through-hole connected together. Along the second direction Y, the cross-sectional shape of the first through-hole is rectangular, and the cross-sectional shape of the second through-hole is trapezoidal, and the method for forming the first through-hole and the second through-hole includes:

FIG. 21 to FIG. 23 are cross-sectional views of the structure along the aa' cutline. With reference to FIG. 21, the isolation structure 103 is subjected to a modification process to form the first region 41 and the second region 42, and the isolation structure 103 of the first region 41 and the isolation structure 103 disposed in the second region 42 is far away from the side of the substrate 100, and in the direction along the isolation structure 103 to the substrate 100, the etching ratio of the isolation structure 103 in the first region 41 is constant, and the etching ratio to the isolation structure 103 in the second region 42 becomes gradually smaller. In this way, in the subsequent process of etching the isolation structure 103, in the direction along the top of the isolation structure 103 to the bottom of the isolation structure 103, the etching amount of the first region 41 remains unchanged by the etching process, and the etching process does not change the etching amount of the first region 41. The etching amount of the second region 42 gradually decreases, so that the cross-sectional shape of the third groove formed in the first region 41 is rectangular, and the shape of the fourth groove formed in the second region 42 is an inverted trapezoid. That is to say, by modifying the isolation structure 103 itself to control the etching amount of the isolation structure 103 in the etching process, it is possible to form two connected third and fourth through-holes with different shapes in a one-step etching process, thus saving the step of forming the mask layer 104, and also reducing the number of etching steps, greatly improving the efficiency of manufacturing the semiconductor structure.

Specifically, in some embodiments, along the direction from the top of the isolation structure 103 to the bottom of the isolation structure 103, the etching process can be controlled to keep the doping ion concentration of the isolation structure 103 in the first region 41 constant, and control the etching process gradually increases the doping ion concentration of the isolation structure 103 in the second region 42.

Referring to FIG. 22, an etching process is performed on the isolation structure 103 to form a third groove 51 in the first region and a fourth groove 52 in the second region. In the direction along the top of the isolation structure 103 pointing to the bottom of the isolation structure 103, the etching amount of the first region 41 by the etching process remains unchanged, and the etching amount of the second region 42 gradually decreases, so that at the second cross-sectional shape of the third groove 51 formed in the first region 41 is rectangular, and the shape of the fourth groove 52 formed in the second region 42 is an inverted trapezoid. Specifically, in some embodiments, the method for performing an etching process on the isolation structure 103 may include: performing a patterning process on the top surface of the isolation structure 103 to define the opening of the third groove 51; 103 is etched until a part of the top surface of the substrate 100 is exposed.

FIG. 22 and FIG. 23, the third sub-support layer 61 is formed in the third groove 51, and the fourth sub-support layer 62 is formed in the fourth groove 52. The third sub-support layer 61 is filled in the third groove 51, so that the cross-sectional shape of the formed third sub-support layer 61 is consistent with the cross-sectional shape of the third groove 51, and is rectangular. The fourth sub-support layer 62 is filled in the fourth groove 52, so that the cross-sectional shape of the formed fourth sub-support layer 62 is consistent with the cross-sectional shape of the fourth groove 52, which is an inverted trapezoid. Specifically, in some embodiments, a deposition process may be used to form the third sub-support layer 61 in the third groove 51, and form the fourth sub-support layer 62 in the fourth groove 52.

Etching the isolation structure 103 disposed between the two third sub-support layers to form a first through-hole. Since the cross-sectional shape of the third sub-support layer is rectangular, in the isolation structure 103 between adjacent third sub-support layers, the width of the top is consistent with the width of the bottom, so when using the third sub-support layer as a mask to etch After the isolation structure 103 between the third sub-support layers, the formed first through-hole is rectangular.

Etching the isolation structure 103 disposed between the two fourth sub-support layers to form a second through-hole. Since the cross-sectional shape of the fourth sub-supporting layer is an inverted trapezoid, when the fourth sub-supporting layer is used as a mask to place behind the isolation structure 103 between adjacent fourth sub-supporting layers, the cross-sectional shape of the formed second through-hole is trapezoidal.

In some embodiments, the etching ratio of the etching process to the first region is equal to the etching ratio of the etching process to the top of the second region. That is to say, the difference between the etch ratio of the etching process to the joining point of the first region and the second region is small, so that the difference between the etching ratio of the etching process to the first region and the etching process to the second region can be avoided. The difference between the etching ratio is too large, resulting in the formation of the side of the joining point of the first through-hole and the second through-hole is not a smooth transition shape, resulting in the exposure of the first through-hole and the second through-hole after etching When the first sacrificial layer 101 is used, the difference in etching amount between the first sacrificial layer 101 at the joining point of the first through-hole and the second through-hole is too large, so that the joining point of the first through-hole and the second through-hole Correspondingly, the shape of the channel region exposed by the semiconductor columns 102 is inconsistent.

Referring to FIG. 12, after the through-hole 105 is formed, the first sacrificial layer 101 exposed by the through-hole 105 is etched, and part of the first sacrificial layer 101 is removed to expose the surface of the channel region of each semiconductor columns 102. Since the area of the first sacrificial layer 101 exposed at the top of the through-hole 105 is smaller than the area of the first sacrificial layer 101 exposed at the bottom of the through-hole 105, the final etching amount of the first sacrificial layer 101 at the top of the through-hole 105 will not be too large, the etching amount of the first sacrificial layer 101 at the bottom will not be too small, so that the etching amount of the first sacrificial layer 101 at the top of the through-hole 105 and the first sacrificial layer at the bottom of the through-hole 105 can be compensated due to process reasons. There is a difference between the etching amount of the layer 101, so that each channel region finally exposed has the same or similar morphology.

Specifically, in some embodiments, the material of the first sacrificial layer 101 is silicon germanium, the first sacrificial layer 101 can be etched by a dry etching process, and the gas used for the dry etching can be It is an F (fluorine)-containing gas, for example, hydrogen fluoride gas.

Figure 24:
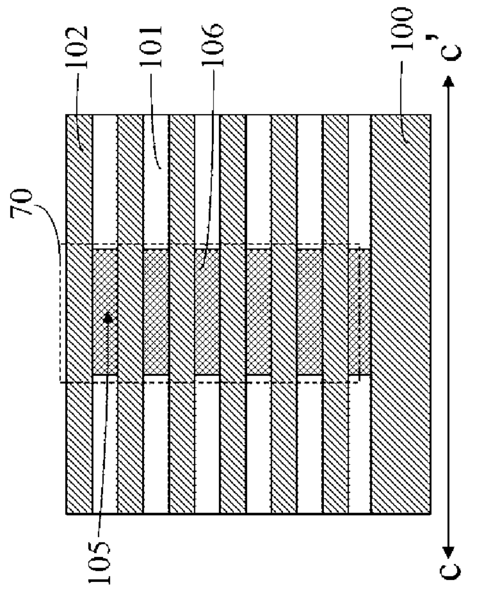

Referring to FIG. 24, FIG. 24 is a cross-sectional view in the cc' direction, and the cc' direction can refer to FIG. 9. In some embodiments, it also includes: forming a word line 106, and the word line wraps the channel region of a row of semiconductor columns 102 70 sides. The word line can be used as the gate of the transistor to control the conduction of the source and the drain of the transistor. In some embodiments, before forming the word line, it may further include: forming a gate dielectric layer on the side of the semiconductor columns 102 in the channel region 70, and the gate dielectric layer surrounds the side of the semiconductor columns 102 in the channel region. Specifically, in some embodiments, a gate dielectric layer may be formed on the side of the semiconductor columns 102 in the channel region by using a deposition process, and the deposition process may be any one of an atomic layer deposition process or a thermal oxidation process. The material of the gate dielectric layer may be silicon oxide.

After forming the gate dielectric layer, it also includes: using a deposition process to form a barrier layer on the surface of the gate dielectric layer, and the barrier layer prevents the interdiffusion between the ions in the word line and the ions in the semiconductor columns 102. In some embodiments, the material of the barrier layer may be silicon nitride.

After forming the barrier layer, a word line 106 is formed on the barrier layer surface of each semiconductor columns 102 in a column of semiconductor columns 102 by using a deposition process, and the word line 106 surrounds the surface of each barrier layer in a column of semiconductor columns 102. Since in a column of semiconductor columns 102, the shape of each channel region exposed after etching the first sacrificial layer 101 is the same or similar, so that the area of the surface of the channel region where the word line is formed to cover each semiconductor columns 102 is the same or similar. Therefore, the control ability of the word line on the channel region 70 of each semiconductor columns 102 is the same or similar, and the overall performance of the semiconductor structure is improved.

In the method for forming the semiconductor structure provided in the foregoing embodiments, the width of the bottom of the formed through-hole 105 is greater than the width of the top of the through-hole 105, that is, the area of the sacrificial layer exposed at the top of the through-hole 105 is smaller than the area of the sacrificial layer exposed at the bottom of the through-hole 105. In this way, the first sacrificial layer 101 exposed by the through-hole 105 is etched, and part of the first sacrificial layer 101 is removed to expose the top surface and the bottom surface of each semiconductor columns 102, so that finally the top of the through-hole 105. The etching amount of the first sacrificial layer 101 is not too large, and the etching amount of the first sacrificial layer 101 at the bottom is not too small, so as to compensate for the large etching degree of the sacrificial layer at the top of the through-hole 105 due to process reasons, the etching degree of the first sacrificial layer 101 at the bottom of the through-hole 105 is small, so that each semiconductor columns finally exposed has the same or similar morphology.

Figure 25:
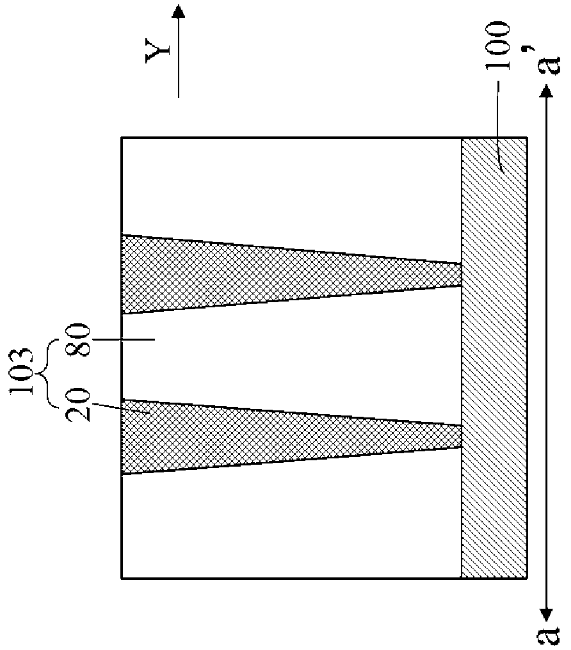
FIG. 25 is a schematic cross-sectional structural diagram of a semiconductor structure provided by an embodiment of the present disclosure.

Correspondingly, refer to FIG. 25. FIG. 25 is a schematic cross-sectional structure diagram of a semiconductor structure provided by an embodiment of the present disclosure. FIG. 25 is a schematic cross-sectional structural diagram along the aa' cutline, and the aa' cutline can refer to FIG. 9. On the other hand, the embodiments of the present disclosure also provide a semiconductor structure, which can be fabricated by the semiconductor structure fabrication method provided in the previous embodiment, including: a substrate 100; disposed on the substrate 100, along the first direction X (refer to FIG. 9) and semiconductor columns 102 arranged in a vertical array (refer to FIG. 9); an isolation structure 103 disposed between adjacent semiconductor columns 102 along the first direction X, the isolation structure includes an isolation substructure 80 and along the second direction Y. The support layer structure 20 disposed on both sides of the isolation substructure 80; in the second direction Y, the width of the bottom of the isolation substructure 80 is greater than the width of the top of the isolation substructure 80, and the width of the top of the support layer structure 20 is greater than the bottom of the support layer structure 20 Width, the second direction Y is perpendicular to the first direction. The isolation structure 130 is used to isolate adjacent semiconductor columns.

In some embodiments, the semiconductor columns also includes a channel region, and the channel region is used as a channel of a transistor. In a vertically arranged semiconductor column, the corresponding semiconductor columns morphology of each channel region same or similar.

In some embodiments, it also includes: a word line, the word line covers the sides of each channel region of a column of semiconductor columns vertically arranged along the second direction, the word line can be used as the gate of the transistor, and It is used to control the conduction of the source and drain of the transistor.

In some embodiments, it also includes an isolation layer, the isolation layer is disposed between the vertically adjacent semiconductor columns, and the isolation layer is disposed on both sides of the word line, respectively on the two sides opposite to the word line touch. The isolation layer can be used as an isolation structure and a support structure between vertically stacked semiconductor columns, and plays the role of isolation and support. In some embodiments, the material of the isolation layer may be silicon oxide.

Semiconductor structure can be a memory, and in some embodiments, memory can be DRAM (Dynamic Random Access Memory), SRAM (Static Random-Access Memory) or SDRAM (Synchronous Dynamic Random-Access Memory).

Those of ordinary skill in the art can understand that above-mentioned each embodiment is the concrete embodiment that realizes the present disclosure, and in actual application, can make various changes to it in form and detail, and not depart from this disclosure spirit and scope. Any person skilled in the art can make respective changes and modifications without departing from the spirit and scope of the present disclosure, so the protection scope of the present disclosure should be based on the scope defined by the claims.

The invention claimed is:

1. A method for fabricating a semiconductor structure, comprising:
- providing a substrate;
- forming stacked structures on the substrate, wherein the stacked structures are arranged at intervals along a first direction, wherein each of the stacked structures comprises first sacrificial layers and semiconductor columns stacked alternately along a vertical direction perpendicular to a surface of the substrate;
- forming an isolation structure, wherein the isolation structure is disposed between adjacent stack structures along the first direction;
- etching the isolation structure to form a through-hole, wherein the through-hole exposes a part of a surface of the substrate, and also exposes at least a side surface of the stacked structures, wherein in a second direction, a bottom width of the through-hole is greater than a top width of the through-hole, and wherein the second direction is perpendicular to the first direction, and perpendicular to the vertical direction; and
- performing a lateral etching on exposed first sacrificial layers along the through-hole, removing a portion of the first sacrificial layers to expose top surfaces and bottom surfaces of the semiconductor columns.

2. The method for fabricating the semiconductor structure according to claim 1, wherein a ratio of a width of a top surface of the through-hole to a width of a bottom of the through-hole is in a range from 0.75 to 0.95.

3. The method for fabricating the semiconductor structure according to claim 1, wherein forming the through-hole comprises:
- performing an etching process on the isolation structure, to form two grooves spaced along the second direction in the isolation structure, wherein the two grooves expose a part of a surface of the substrate, and also expose a part of a side surface of the stacked structures extending along the second direction; wherein in the second direction, a top width of each of the two grooves is greater than a bottom width of each of the two grooves;
- forming two support layer structures in the two grooves respectively, wherein side surfaces of the two support layer structures are in contact with the isolation structure;
- etching the isolation structure between the two support layer structures, exposing the side surfaces of the support layer structure, and forming the through-hole.

4. The method for fabricating the semiconductor structure according to claim 3, wherein a cross-sectional shape of each of the two grooves perpendicular to the first direction is an inverted trapezoid.

5. The method for manufacturing a semiconductor structure according to claim 3, wherein, along the second direction, a ratio of a width of a top surface to a width of a bottom surface of each of the two grooves is in a range of 1.05-1.25.

6. The method for fabricating the semiconductor structure according to claim 3, wherein the through-hole comprises: a first through-hole and a second through-hole connected to each other, wherein the first through-hole is disposed on a side of the second through-hole away from the substrate, and wherein a cross-sectional shape of the first through-hole perpendicular to the first direction is rectangular, and wherein the cross-sectional shape of the second through-hole perpendicular to the first direction is trapezoidal.

7. The method for fabricating the semiconductor structure according to claim 6, wherein the through-hole comprises:
- performing an etching process on the isolation structure, to form two first grooves spaced along the second direction in the isolation structure, wherein the first groove exposes a part of the isolation structure, and in the second direction, a cross-sectional shape of the first groove perpendicular to the first direction is rectangular;
- forming a mask layer on the side wall of the first groove;
- etching the isolation structure exposed from the bottom surface of the first groove to form a second groove, wherein the second groove and the first groove are connected to each other, wherein a cross-sectional shape of the second groove perpendicular to the first direction is an inverted trapezoid;
- forming first sub-support layers in the first grooves, and forming second sub-support layers in the second grooves;
- etching the isolation structure between two first sub-support layers to form the first through-hole; and
- etching the isolation structure between two second sub-support layers to form the second through-hole;
- wherein the first through-hole connects with the second through-hole to form one through-hole.

8. The method for fabricating the semiconductor structure according to claim 7, wherein, in a direction perpendicular to the substrate, a ratio of a height of the first through-hole to a height of the second through-hole ranges from 0.1-0.3.

9. The method for fabricating the semiconductor structure according to claim 7, wherein, along the second direction, a width of the first groove is greater than a top width of the second groove, after forming the first groove, the method includes:
- forming a mask layer on a top surface of the isolation structure exposed from the side wall of the first groove by a deposition process, wherein the mask layer encloses a first sub-groove; wherein along the second direction, a width of the first sub-groove is smaller than the width of the first groove;
- etching the isolation structure exposed at a bottom of the first sub-groove to form the second groove; wherein along the second direction, a top width of the second groove is equal to a top width of the first sub-groove; and
- removing the mask layer.

10. The method for fabricating the semiconductor structure according to claim 7, wherein, along the second direction, a width of the top of the first groove is the same as a width of the top of the second groove, after forming the first groove, the method comprises:

processing the isolation structure exposed on a side wall of the first groove, so as to convert a portion of the isolation structure to a mask layer having a preset thickness; and etching the isolation structure exposed at the bottom of the first groove to form a second groove; wherein along the second direction, a top width of the second groove is equal to a width of the first groove.

11. The method for fabricating the semiconductor structure according to claim 10, wherein the isolation structure comprises silicon oxide, and wherein processing the isolation structure exposed on the side wall of the first groove comprises: performing nitridation treatment on the isolation structure exposed on the side wall of the first groove, so as to form silicon nitride with a preset thickness.

12. The method for fabricating the semiconductor structure according to claim 3, wherein forming the two grooves comprises:

performing a modification process on the isolation structure, in the direction along the isolation structure to the substrate, an etching ratio for top of the isolation structure is greater than an etching ratio for the bottom of the isolation structure; and performing an etching process on the isolation structure to form the two grooves.

13. The method for fabricating a semiconductor structure according to claim 12, wherein, in a direction from the isolation structure pointing to the substrate, an etching ratio decreases gradually in the etching process for the isolation structure.

14. The method for fabricating the semiconductor structure according to claim 12, wherein the through-hole comprises: a first through-hole and a second through-hole connected to each other, and along the first through-hole in the second direction, a cross-sectional shape of the first through-hole is rectangular, and a cross-sectional shape of the second through-hole is trapezoidal;

wherein forming the first through-hole and the second through-hole comprises:

performing a modification process on the isolation structure to form a first region and a second region, wherein the isolation structure of the first region is disposed on the second region of the isolation structure at one side away from the substrate; wherein in the direction along the isolation structure to the substrate, an etching ratio of the isolation structure in the region is constant, and wherein an etching ratio of the isolation structure in the second region is gradually reduced;

performing an etching process on the isolation structure, so as to form a third groove in a first region, and forming a fourth groove in the second region;

forming third sub-support layers in the third groove, and forming fourth sub-support layers in the fourth groove;

etching the isolation structure between two third sub-support layers to form the first through-hole; and etching the isolation structure between two fourth sub-support layers to form the second through-hole.

15. The method for fabricating the semiconductor structure according to claim 14, wherein an etching ratio of the first region in the etching process is equal to an etching ratio of the second region in the etching process.

16. The method for fabricating the semiconductor structure according to claim 1, wherein the semiconductor columns comprise: a channel region, and wherein the removing the portion of the first sacrificial layers to expose top surfaces and bottom surfaces of each semiconductor columns comprises: exposing the top surface and the side surface of the semiconductor columns in the channel region, and forming a word line around side surfaces of the semiconductor columns in the channel region.

17. The semiconductor structure, manufactured by the method of fabricating the isolation structure according to claim 1, comprising:

the substrate;

semiconductor columns arranged in an array along the first direction and the vertical direction on the substrate;

the isolation structure disposed between adjacent semiconductor columns along the first direction, wherein the isolation structure comprises: an isolation substructure and the support layer structure disposed on both sides of the isolating substructure along the second direction; wherein in the second direction, a bottom width of the isolating substructure is greater than a top width of the isolating substructure, wherein a top width of the support layer structure is larger than a bottom width of the support layer structure, and wherein the second direction is perpendicular to the first direction.

* * * * *